United States Patent [19]

Hartmann

[11] 4,454,488
[45] Jun. 12, 1984

[54] SURFACE ACOUSTIC WAVE RESONATOR WITH MIDDLE GRATING

[75] Inventor: Clinton S. Hartmann, Dallas, Tex.

[73] Assignee: R F Monolithics, Inc., Dallas, Tex.

[21] Appl. No.: 396,418

[22] Filed: Jul. 8, 1982

[51] Int. Cl.³ .......................... H03H 9/64; H03H 9/25
[52] U.S. Cl. ................................. 333/195; 310/313 D; 333/194; 333/196
[58] Field of Search ............................... 333/150–155, 333/193–196; 310/313 R, 313 A, 313 B, 313 C, 313 D; 331/107 A

[56] References Cited

U.S. PATENT DOCUMENTS

| | | | |
|---|---|---|---|
| 3,886,504 | 5/1975 | Hartmann et al. | 333/195 |
| 3,970,970 | 7/1976 | Worley | 333/195 |
| 4,054,851 | 10/1977 | Borner et al. | 333/195 |
| 4,144,507 | 3/1979 | Shreve | 333/195 |

OTHER PUBLICATIONS

Shreve et al.–"Fabrication Saw of Resonators for Improved Long Term Aging", Hewlett–Packard Laboratories, Palo Alto, Ca., 94304, 1978; pp. 573–579.

Tanski–"Developments in Resonators on Quartz", 1977 Ultrasonics Symposium Proceedings, IEEE Cat. #77CH1264-1SU; pp. 900–904 and 904A.

Primary Examiner—Marvin L. Nussbaum
Attorney, Agent, or Firm—Kanz, Scherback & Timmons

[57] ABSTRACT

A surface wave resonator device (10) includes a substrate (12) having a surface layer of piezoelectric material (14), first and second reflective grating structures (16 and 18) and a middle grating structure (40). The middle grating structure includes an odd multiple of one-quarter wavelength for the resonant frequency of the first and second reflective grating structures. The surface acoustic wave transmission velocity of the middle grating structure is substantially equal to the surface acoustic wave transmission velocity of the first and second reflective grating structures. One arrangement includes a surface acoustic wave input transducer (52) and a surface acoustic wave output transducer (58).

15 Claims, 8 Drawing Figures

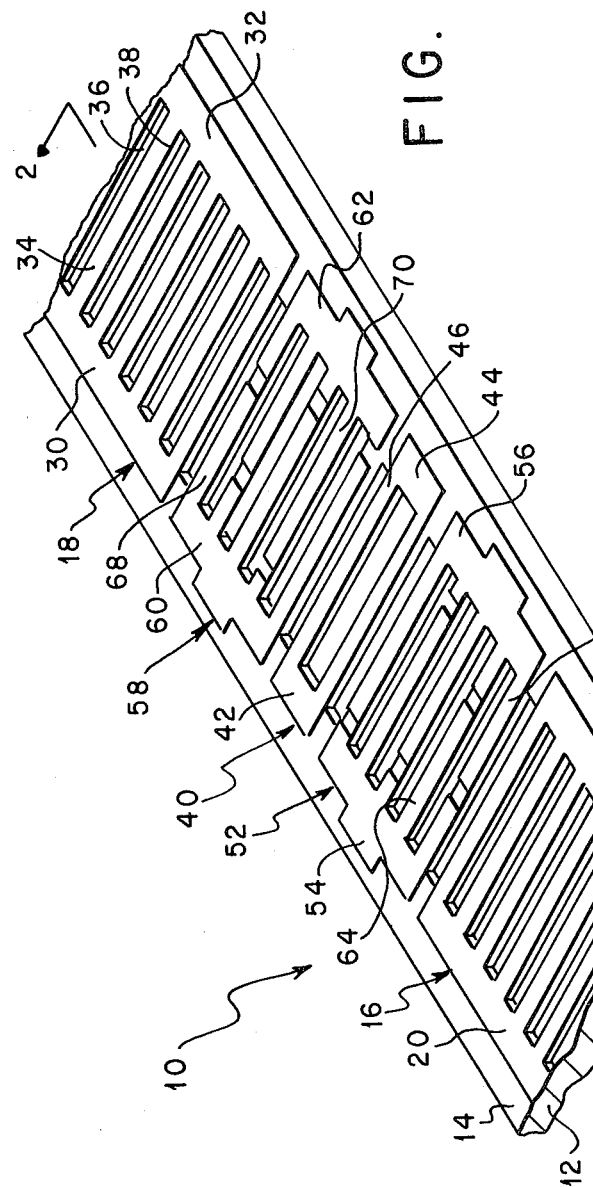
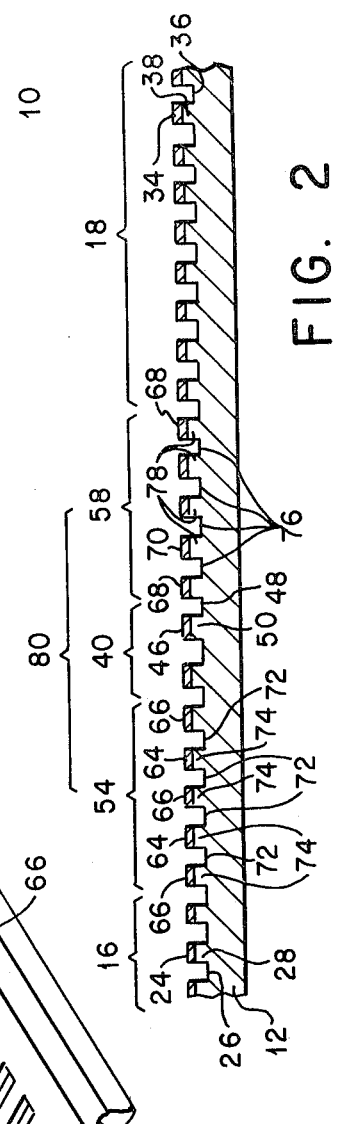

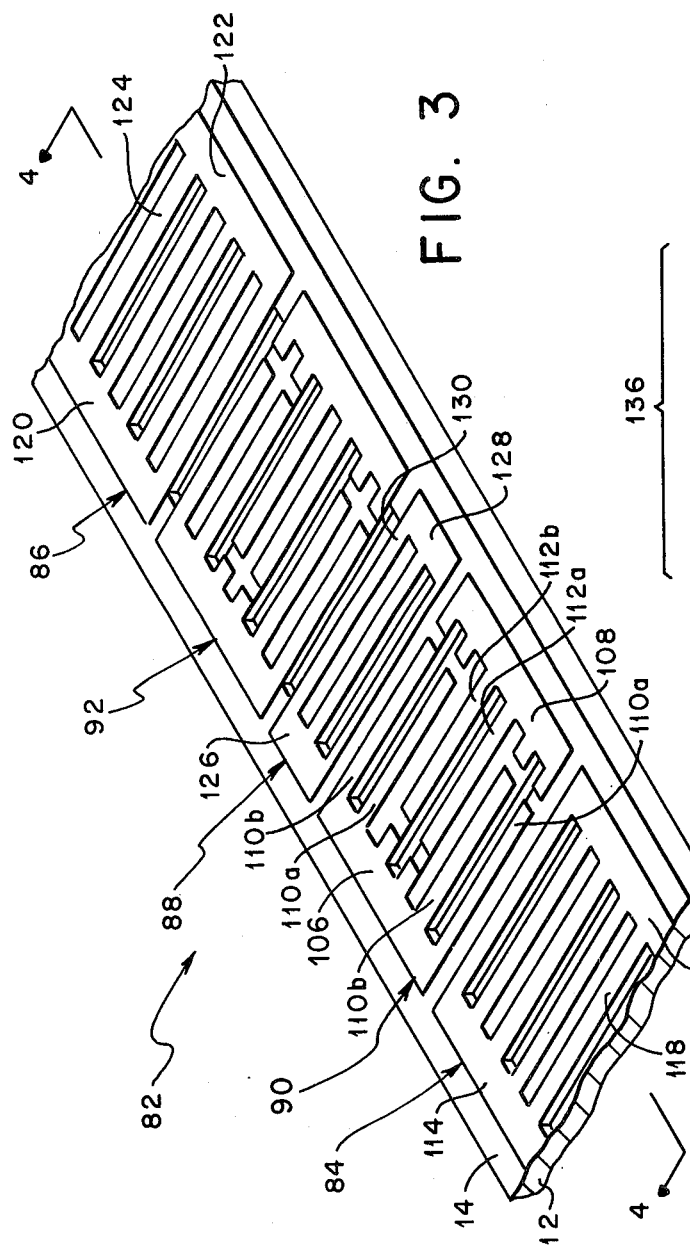
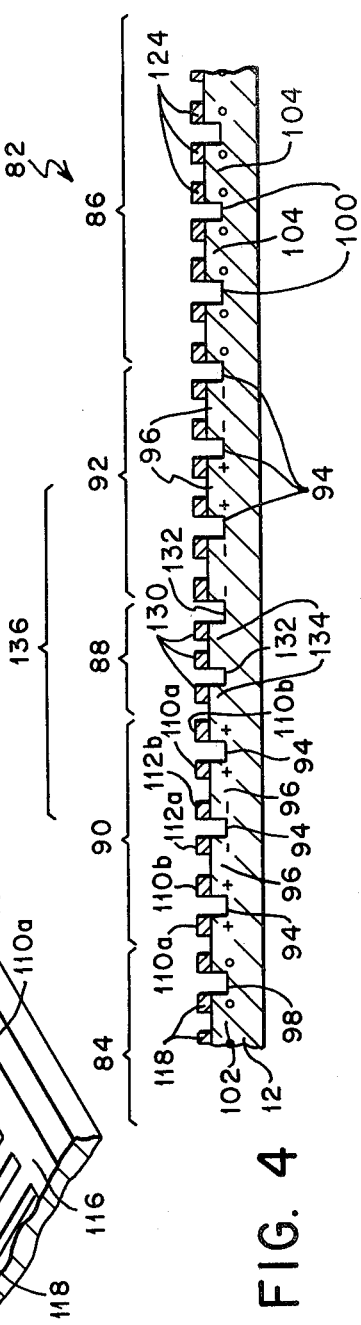

SURFACE ACOUSTIC WAVE RESONATOR WITH MIDDLE GRATING

DESCRIPTION

TECHNICAL FIELD

The present invention relates generally to acoustic surface wave devices and in one of its aspects to surface wave resonator devices.

Surface acoustic wave devices known as SAW devices have many uses in the UHF and VHF frequency ranges. SAW devices are especially useful as resonators in these frequency ranges.

BACKGROUND ART

U.S. Pat. No. 3,360,749 shows a basic SAW device using interdigital electrode transducers. Such a SAW device has a substrate with at least a surface layer of piezoelectric material and acoustic surface wave transducers disposed on the piezoelectric surface. The transducers convert between electrical signals and acoustic surface waves propagating on the piezoelectric surface. The transducers can convert from an input electrical signal to output acoustic surface waves or from input acoustic surface waves to an output electrical signal. In the very popular structure shown, there is a one-to-one correspondence between the impulse response of the transducer and its electrode geometry as pointed out in the invited paper of April, 1973 *IEEE Transactions on Microwave Theory and Techniques* entitled "Impulse Model Design of Acoustic Surface-Wave Filters" by the inventor of the present invention along with D. T. Bell, Jr. and R. C. Rosenfeld, Volume MTD-21, No. 4, Pages 162–175. The electrodes are spaced to specify each half cycle in the impulse response. The class of devices realized by this type of transducer is generally referred to as transversal filters, in that the surface acoustic wave makes a single transverse from the input transducer structure to the output transducer structure.

A second major category of SAW devices encompasses resonator devices which were first disclosed by the inventor of the present invention and others in a paper entitled "UHF Surface Acoustic Wave Resonators", 1974 *Ultrasonic Symposium Proceedings, IEEE*, Catalog No. 74 CHO 896-ISU and U.S. Pat. No. 3,886,504. The basic resonator device consists of two arrays of grating reflectors which are placed to form a surface acoustic wave resonant structure. Interdigital SAW transducers are normally placed inside of a cavity region of the resonator to couple energy into and out of the structure. Resonators are frequently referred to as recursive devices, in that a surface wave bounces back and forth many times. Resonators are generally usable for narrow bandpass filtering and for frequency control application in the VHF and UHF frequency range.

The grating arrays which form the distributed reflective structures for resonators can be metallic or dielectric strips deposited on the surface of the piezoelectric crystal, grooves etched into the surface of the crystal, impurities ion-implanted into the surface, or any other disturbance to the surface which can result in a surface acoustic wave reflection. The transducer electrodes in a normal SAW interdigital transducer can cause reflections. These reflections internal to a SAW transducer have been referred to as "second order" or "higher order" effects in the more traditional interdigital transducer device as pointed out in papers entitled "Second Order Effects in Surface Wave Devices", *IEE Transactions on Sonics and Ultrasonics*, Volume SU-19, No. 3, July, 1972, by the present inventor and others and "Fundamental-and-Harmonic-Frequency Surface-Model Analysis of Interdigital Transducers with Arbitrary Metalization Ratios and Pularity Sequences", *IEEE Transactions on Microwave Theory and Technique*, Volume MTD-23, No. 11, November, 1975, by W. Richard Smith and William F. Pedler. The interdigital reflections destroy the one-to-one correspondence between the transducer impulse response and the electrode geometry, and have thus been viewed as detrimental to the transversal-type device. Internal reflection effects in transversal filters have been eliminated by increasing the number of electrodes per acoustic wave length resulting in the split-electrode geometry which typically has four electrodes per wave length as pointed out in "Reflection of a Surface Wave from Three Types of ID Transducers", 1972 *Ultrasonic Symposium Proceedings, IEEE*, No. 72 CHO 708-8SU by de Vries, et al. and U.S. Pat. No. 3,727,155 to de Vries. In split electrode transducers, the reflections from one electrode of the transducer are cancelled by reflections from an adjacent transducer electrode. In a three electrode per wave length geometry shown in U.S. Pat. No. 3,686,518 to the present inventor and William S. Jones, similar cancellation of reflective waves occurs but only when reflections from three electrodes are considered.

In a resonator having first and second reflective grating structures on a piezoelectric surface, an acoustic surface input transducer and an acoustic wave output transducer between the reflective grating structures, the distance from the center drive of each of the transducers to the associated reflection center of the respective gratings is typically around 80 wavelengths of the center operating frequency. The ratio of the distance from the center of drive of each of the transducers to the associated reflection center of the respective grating to the distance between the two-grating centers is typically less than 0.2 to 0.3 in order to prevent unwanted longitudinal modes. It is also desirable to make the transducers as long as possible to increase the coupling. Increasing the transducers length increases the above said ratio with the result is that at some point the resonant condition is satisfied at more than one frequency in the reflection bandwidth. The result has been that only weak coupling has been possible for spurious free devices. Shortening the length of the transducers, and thus reducing the coupling, leads to increased insertion loss in some applications and makes wider bandwidth filters unattainable since the ratio of the distance from the center of drive of each of the transducers to the associated reflection center of the respective gratings to the distance between the drive centers controls the bandwidth achievable.

Another factor which has had an important impact on fabrication and design is the desire to achieve the highest possible device quality factor, known as the device Q. It has been found that one of the more important loss mechanisms in SAW resonators is scattering into bulk modes which takes place at the point where the gratings terminate inside the cavity. Also, similar effects are obtained from scattering from the transducer electrode fingers. One of the more popular methods for removing this loss has been the so called "buried transducer" configuration, in which the electrodes of the transducers are themselves buried in grooves etched in the crystal surface as described in an article by William J. Tanski entitled "Developments in Resonators on Quartz" in the 1977 *Ultrasonics Symposium Proceedings*, IEEE. While this technique reduces a significant loss mechanism, it also increases the fabrication sensitivity of the device. It is found that in this case the absolute placement accuracy of the first photo mask relative to the second photo mask must typically be of the order of 1% of the surface wave length if accurate frequency reproducibility is to be achieved. Good resonance behavior can be achieved for larger placement inaccuracy than this, but the required frequency tracking accuracy cannot be achieved with poorer fabrication accuracy. At 200 megahertz, this implies a relative mask alignment accuracy of approximately 1500 angstroms. Weighted gratings achieved by tapering the depth of the gratings can also be used to reduce bulk scattering as described in an article by William R. Shreve, et al entitled "Fabrication of SAW Resonators for Improved Long Term Aging" in the 1978 *Ultrasonic Symposium Proceedings*, IEEE.

Yet another problem found with prior art devices has been that of poor frequency control. A device Q of 10,000 implies frequency accuracy to one part in $10^5$ to $10^6$. In oscillators, frequency control is achieved to about 1% or less of the reciprocal Q. In filters, it is necessary to control relative frequency to roughly 2% to 10% of the filter bandwidth. Exact frequency is controlled by satisfying resonance conditions, i.e., round trip phase shift must be an exact multiple of 360 degrees. Problems arise from different propagation regions inside the cavity, e.g. grooved regions, transducer regions and open regions which have flat surface. All have the same velocity to the first order, but it is necessary to look for parts in $10^6$. As a result, very tiny effects are devastating.

DISCLOSURE OF INVENTION

In accordance with the present invention, a surface wave resonator device includes a substrate means having at least a surface layer of piezoelectric material, means defining a basic resonator having first and second reflecting grating structures on the piezoelectric surface of the substrate means and being responsive to surface acoustic waves propagating on the piezoelectric surface of the substrate means, and means defining a middle grating structure on the piezoelectric surface of the substrate means between the first and second reflective grating structures and being responsive to surface acoustic waves propagating on the piezoelectric surface of the substrate means. In accordance with a preferred arrangement, the means defining a middle grating structure has a surface acoustic wave transmission velocity for a predetermined frequency range substantially equal to the surface acoustic wave transmission velocity for the predetermined frequency range in the areas of the piezoelectric surface over which the first and the second reflective grating structures are disposed.

In one arrangement, the surface wave resonator device includes acoustic wave input transducer means disposed on the piezoelectric surface of the substrate means and being operable to convert an input electrical signal to acoustic surface waves propagating on the piezoelectric surface of the substrate means and acoustic surface wave output transducer means disposed on the piezoelectric surface of the substrate means and being operable to convert acoustic surface waves propagating on the piezoelectric surface of the substrate means to an output electrical signal. The distance between the input transducer means and the output transducer means is an integral odd number multiple of $\frac{1}{4}$ wavelength of the center frequency of the predetermined frequency range.

In one arrangement, the first and the second reflective grating structures and the middle grating structure all consist of metal fingers. In another arrangement, the first and second reflective grating structures and the middle grating structure all consist of grooves formed in the piezoelectric surface. In yet another arrangement, the first and the second reflective grating structures and the middle grating structure all consist of grooves formed in the piezoelectric surface in combination with metal fingers on the ridges formed between the grooves.

These and other objects, advantages and features of the invention will be apparent from the following description taken with reference to the accompanying drawing, wherein is shown the preferred embodiments of this invention.

BRIEF DESCRIPTION OF DRAWING

FIG. 1 is a perspective view partially cut away of a surface wave resonator device according to the present invention using overlap transducer weighting;

FIG. 2 is a sectional view taken along line 2—2 of the device of FIG. 1;

FIG. 3 is a perspective view partially cut away of a surface wave resonator device according to the present invention using a split electrode resonator means;

FIG. 4 is a sectional view taken along lines 4—4 of the device of FIG. 3;

BEST MODE FOR CARRYING OUT THE INVENTION

Figure 5:
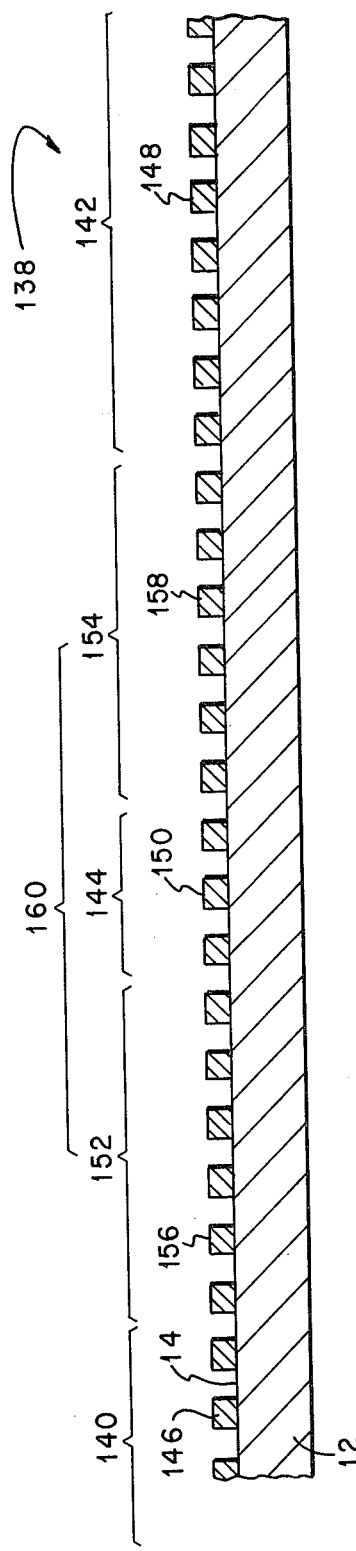
FIG. 5 is a sectional view similar to that of FIG. 2 and FIG. 4 of a surface wave resonator device according to the present invention using metal finger grating structures.

Referring now to the drawing, and in particular to FIG. 1, a surface wave resonator device according to the present invention is referred to generally by reference numeral 10. This wave resonator device 10 includes substrate means 12 having at least a surface layer 14 of piezoelectric material and means defining a basic resonator having first and second reflective grating structures 16 and 18 on piezoelectric surface 14. First and second reflective grating structures 16 and 18 are responsive to acoustic waves propagating on the piezoelectric surface in a manner which is conventional for SAW resonators. First reflective grating structure 16 includes opposing pads 20 and 22 of electrically conducting material connected by electrically conducting strips 24. Means 26 defines reflective structure 28 by forming grooves in piezoelectric surface 14 between strips 24. Similarly, second reflective grating structure 18 includes opposing pads 30 and 32 of electrically conducting material joined by electrically conducting strips 34. Means 36 defines reflective structures 38 by forming grooves in piezoelectric surface 14 between electrically conducting strips 34. Electrically conducting strips 24 and 34 and their accompanying reflective structures 28 and 38 are spaced at substantially ¼ wavelength intervals for a predetermined frequency, the frequency at which reflections are desired.

Surface wave resonator device 10 further includes means 40 defining a middle grating structure on piezoelectic surface 14 between first and second reflective grating structures 16 and 18. Means 40 includes opposing pads 42 and 44 of electrically conducting material connected by electrically conducting strips 46. Means 48 defines reflective structures 50 by forming grooves in piezoelectric surface 14 adjacent to strips 46. In a preferred form, the distance between adjacent reflective structures 50 is ¼ wavelength for some frequency other than the predetermined frequency which is to say that it is preferred that means 40 defining a middle grating structure has a periodicity which is different from the periodicity of the first and second reflective grating structures 16 and 18 so that means 40 reflects at a frequency other than frequencies in the reflection band of resonator gratings 16 and 18. Means 40 in combination with piezoelectric surface 14 has a surface acoustic wave transmission velocity for the predetermined frequency range substantially equal to the surface acoustic wave transmission velocity for the predetermined frequency range in the areas of piezoelectric surface 14 over which first and second reflective grating structures 16 and 18 are disposed. Only two reflective structures 50 are shown for ease of illustration. Five to fifty reflective structures 50 is a preferred range and seven to twenty-one is most preferred. A lower limit is set by increased bulk mode scattering. Increasing the number of such structures in the center grating by too much moves the periodicity of the center grating too near the preselected frequency and runs into problems with fabrication tolerances.

A preferred form of surface wave resonator device 10 also includes surface acoustic wave input transducer means 52 disposed on piezoelectric surface 14 and being operable to convert an input electrical signal applied between opposing electrically conducting pads 54 and 56 into acoustic surface waves propagating on piezoelectric surface 14, and surface acoustic wave output transducer means 58 disposed on piezoelectric surface 14 and being operable to convert acoustic surface waves propagating on piezoelectric surface 14 to an output electrical signal across opposing electrically conducting pads 60 and 62. Opposing pads 54 and 56 have alternating electrodes 64 and 66 respectively in interdigitated relationship of varying degrees of overlap to define overlap weighting. Similarly, opposing pads 60 and 62 of SAW output transducer 58 have alternating electrodes 68 and 70 respectively in interdigitated relationship of varying degrees of overlap to define overlap weighting. Surface wave resonator device 10 further includes means 72 for defining reflective structures 74 in the area of piezoelectric surface 14 over which input transducer 54 is disposed and means 76 for defining reflective structures 78 in the area of piezoelectric surface 14 over which output transducer 58 is disposed. The distance between centers of reflective structures 74 or 78 is ¼ wavelength of the predetermined frequency, but the distance 80 between the driving centers of input transducer means 52 and output transducer means 58 is an odd multiple of a quarter wavelength of the predetermined frequency. Alternatively, there is an extra quarter wavelength between the reflection centers of the total grating structures on the opposite sides of the center grating. These different measures will normally lead to the same result. The extra quarter wavelength is preferably made up in means 44 defining a middle grating structure although the middle grating structure is of a different periodicity from the other gratings.

Referring to FIG. 3 and FIG. 4, another embodiment of a surface wave resonator device according to the present invention is referred to generally by reference numeral 82. Surface wave resonator device 82 includes means defining a basic resonator having first and second reflective grating structures 84 and 86 disposed on piezoelectric surface 14 for responding to acoustic surface waves propagating on the piezoelectric surface and means 88 defining a middle grating structure on piezoelectric surface 14 between the first and second reflective grating structures 84 and 86 for responding to acoustic surface waves propagating on the piezoelectric surface. Surface wave resonator device 82 also includes surface acoustic wave input transducer means 90 disposed on piezoelectric surface 14 and being operable to convert an input electrical signal to surface acoustic waves propagating on the piezoelectric surface, surface acoustic wave output transducer means 92 disposed on piezoelectric surface 14 and being operable to convert surface acoustic waves propagating on the piezoelectric surface to an output electrical signal. Device 82 further includes means 94 other than transducer means 90 and 92 defining reflective structures 96. Means 94 defining reflective structures 96 causes reflections of acoustic waves in the portion of piezoelectric surface 14 over which input transducer means 90 and output transducer means 92 are disposed. First and second reflective grating structures 84 and 86 also comprise means 98 and 100 respectively for defining reflective structures 102 and 104 respectively.

Input transducer means 90 includes opposing pads 106 and 108 of electrically conducting material having alternating pairs 110 and 112 of electrodes in interdigitated relationship to define a split electrode transducer. Output transducer means 92 is similarly constructed. Means 94 defining reflective structures 96 forms grooves in piezoelectric surface 14 between the electrodes of the pairs of electrodes, which is to say between electrodes 110a and 110b and between electrodes 112a and 112b. First reflective grating structure 84 includes electrically conducting pads 114 and 116 connected by electrically conducting strips 118. Means 98 for defining reflective structures 102 forms grooves in piezoelectric surface 14 between every other electrically conducting strip 118. Similarly, second reflective grating 86 includes electrically conducting pads 120 and 122 connected by electrically conducting strips 124, and means 100 defining reflective structures 104 forms grooves in piezoelectric surface 14 between every other strip 124.

Likewise, middle grating structure 88 includes opposing electrically conducting pads 126 and 128 connected by electrically conducting strips 130. Means 132 define reflective structures 134 by forming grooves between every other strip 130. Once again, however, the distance 136 between the driving centers for input and output transducers 90 and 92 respectively is an odd multiple of ¼ wavelength for a predetermined frequency, where the predetermined frequency is ¼ wavelength between centers of reflective structures 96. Thus, although surface acoustic waves will continue to travel at substantially the same velocity across middle grating structure 88 as across the areas of piezoelectric surface 14 over which first and second reflective grating structures 84 and 86 are disposed, middle grating structure 88 does not cause substantial reflections at the predetermined frequency.

Referring now to FIG. 5, yet another embodiment of a surface wave resonator device according to the present invention is referred to generally by reference numeral 138. Surface wave resonator device 138 is similar in construction to surface wave resonator device 10 except that first and second reflective grating structures 140 and 142 and middle grating structures 144 all consist of metal fingers, 146, 148 and 150 respectively. Device 138 does not include reflective structures disposed over piezoelectric surface 14 in the areas of input and output transducers 152 and 154 except electrically conducting fingers 156 and 158 respectively. Distance 160 between the driving centers of input and output transducers 152 and 154 still includes an extra ¼ wavelength at the predetermined frequency.

Figure 6:
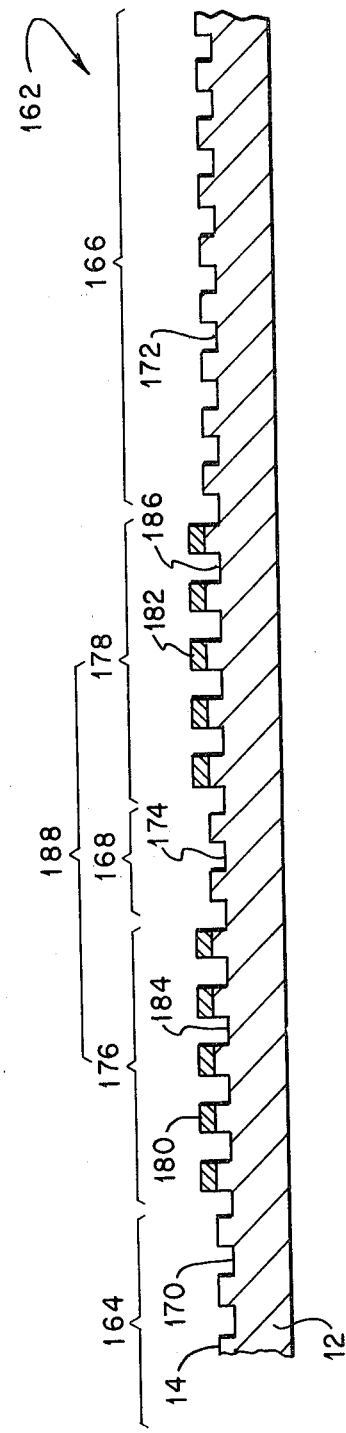
FIG. 6 is a sectional view similar to FIG. 2, FIG. 4 and FIG. 5 of a surface wave resonator device according to the present invention using grating structures which consist essentially of grooves formed in the piezoelectric surface.

Referring now to FIG. 6, another embodiment of a surface wave resonator device according to the present invention is referred to generally by reference numeral 162. Device 162 is similar in construction to device 10, but first and second reflective grating structures 164 and 166 and middle grating structure 168 all consist essentially of grooves, 172 and 174 respectively formed in piezoelectric surface 14. Input and output transducer means 176 and 178 respectively still include electrically conducting fingers 180 and 182. Device 162, however, does form grooves 184 and 186 over the area of piezoelectric surface 14 on which the input and output transducers are disposed. The depths of grooves 184 and 186 are preferrably adjusted to compensate for the height of electrically conducting fingers 180 and 182 respectively so that boundary conditions between the transducer means and their neighboring gratings are minimized, and the velocity of surface acoustic waves remain substantially constant from one section of the device to the next. Once again, distance 188 between the driving centers of input transducer 176 and output transducer 178 is an odd multiple of ¼ wavelength for the predetermined frequency.

Figure 7:
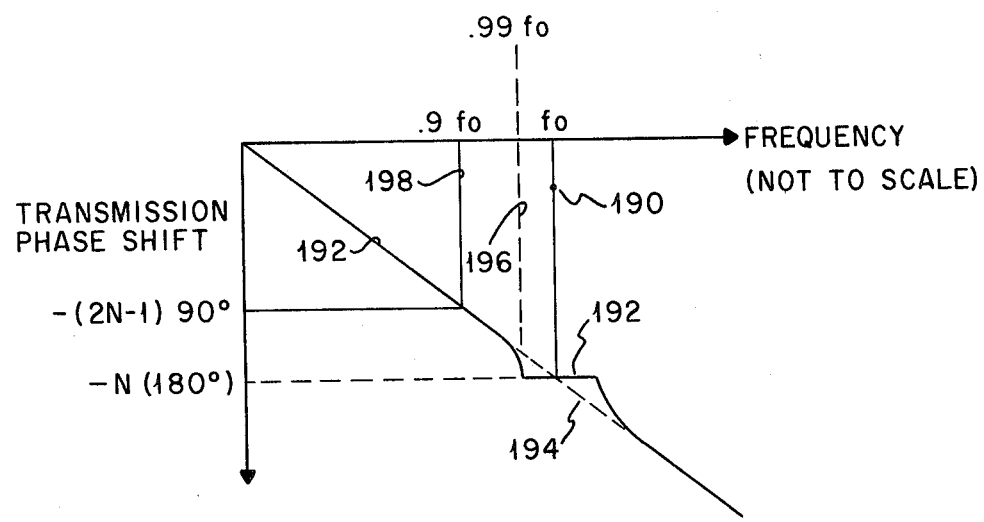
FIG. 7 is a graph of the transmission phase shift for the middle grating structure versus frequency which is not to scale.

Referring now to FIG. 7, a pre-selected center frequency for the middle grating structure is represented generally by $f_0$ and reference numeral 190. A graphical representation of the transmission phase shift versus frequency for the spacer section of a SAW resonator device with an integral grating structure according to the present invention and with an integral number of ½ wavelengths in length is represented generally by solid line 192. It can be seen that there is constant phase shift in the transmission in the vicinity of the center frequency 190. The transmission phase shift versus frequency for the spacer section of a SAW resonator device without a center grating structure is represented generally by dashed line 194.

Figure 8:
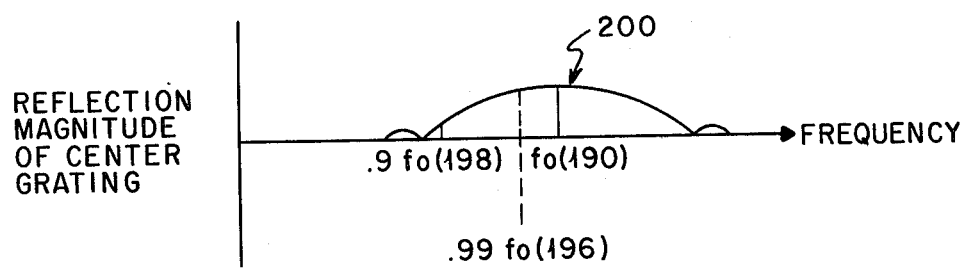
FIG. 8 is a graph of the reflection magnitude of the middle grating structure versus frequency which is not to scale.

The range of frequencies where there is much reflection is typically around one percent of the center frequency of the center grating structure. Below $0.99f_0$, represented graphically by dashed line 196, the transmission phase shift is substantially linear and the same as a center section without a grating structure represented by 194. Referring also to FIG. 8, it can be seen that the reflection of the center grating, represented by reference numeral 200, is at a peak at $f_0$ (190) but is considerably diminished at $0.99f_0$ (196). If a center frequency is chosen for the reflective grating structures, for example 16 and 18 in FIGS. 1 and 2 or 140 and 142 in FIG. 5, of $0.9f_0$, represented graphically by solid line 198, then there is only small reflection from the center grating structure. Also the transmission phase shift of the center grating is substantially linear and substantially the same as the transmission phase shift of the spacer section of a SAW resonator device without center grating structure.

It can now be seen that as a grating, the middle grating of each embodiment of a device according to the present invention reflects a frequency other than the reflection band of the resonator gratings. If the number of strips in the middle grating is greater than the number integral half wavelengths at the predetermined frequency, then the middle grating reflects at a higher frequency than the resonator gratings. The reflections from the middle section at the predetermined frequency, which is the resonant frequency of the resonator, are negligible.

The old problem of bulk scattering has been greatly reduced by use of the present invention in that the grating is now continuous and thus the scattering source at the grating termination is eliminated. In addition, fabrication economy and frequency control have been improved in that only one transmission velocity must be dealt with. Thus, variations in metal thickness, groove depth, and width to gap ratio affect all regions of the device the same. The device is thus highly reproducible. In addition, as a result of the present invention, devices can now be produced where the transducers overlap the inner portions of the reflectors. Coupling can thus be greatly increased.

From the foregoing it will be seen that this invention is one while adapted to attain all of the ends and objects hereinabove set forth, together with other advantages which are obvious and which are inherent to the apparatus.

It will be understood that certain features and subcombinations are of utility and may be employed without reference to other features and subcombinations. This is contemplated by and is within the scope of the claims.

As many possible embodiments may be made of the invention without departing from the scope thereof, it is to be understood that all matters herein set forth or shown in the accompanying drawings is to be interpreted as illustrative and not in a limiting sense.

I claim:

1. A surface wave resonator device comprising in combination:
   substrate means having at least a surface layer of piezoelectric material;
   first and second reflective grating structures disposed on the piezoelectric surface of the substrate means defining a basic resonator for responding to acoustic surface waves propagating on the piezoelectric surface of the substrate means; and
   means defining a middle grating structure on the piezoelectric surface of the substrate means; between the first and second reflective grating structures for responding to acoustic surface waves propagating on the piezoelectric surface of the substrate means, wherein the means defining a middle grating structure in combination with the piezoelectric surface has a surface acoustic wave transmission velocity for a predetermined frequency range which is substantially equal to the surface acoustic wave transmission velocity for the predetermined frequency range in the areas of the piezoelectric surface over which the first and the second reflective grating structures are disposed and the periodicity of the center grating structure is sufficiently different from the periodicity of the first and second reflective grating structures for the reflection magnitude of the center grating structure to be small relative to that of the first and second reflective grating structures at the center frequency for the first and second reflective grating structures.

2. A surface wave resonator device according to claim 1 further comprising:

surface acoustic wave input transducer means disposed on the piezoelectric surface of the substrate means and being operable to convert an input electrical signal to acoustic surface waves propagating on the piezoelectric surface of the substrate means; and surface acoustic wave output transducer means disposed on the piezoelectric surface of the substrate means and being operable to convert acoustic surface waves propagating on the piezoelectric surface of the substrate means to an output electrical signal.

3. A surface wave resonator device according to claim 2 wherein the distance between the driving centers of the input transducer means and the output transducer means is an integral odd number multiple of one quarter wavelength of the center frequency of the predetermined frequency range.

4. A surface acoustic wave resonator device according to claim 3 wherein the first and the second reflective grating structures and the middle grating structure all consist essentially of metal fingers.

5. A surface acoustic wave resonator device according to claim 3 wherein the first and the second reflective grating structures and the middle grating structure all consist essentially of grooves formed in the piezoelectric surface.

6. A surface acoustic wave resonator device according to claim 3 wherein the first and the second reflective grating structures and the middle grating structure all consist essentially of grooves formed in the piezoelectric surface in combination with metal fingers on the ridges formed between the grooves.

7. A surface acoustic wave resonator device according to claim 3 wherein the input transducer is located between the first reflective grating and the middle grating structure, and the output transducer is located between the middle grating structure and the second reflective grating structure.

8. A surface acoustic wave resonator device according to claim 2 wherein the input transducer is located between the first reflective grating and the middle grating structure, and the output transducer is located between the middle grating structure and the second reflective grating structure.

9. A surface wave resonator device according to claim 2 wherein the distance across the middle grating structure is an integral odd number multiple of one quarter wavelength of the center frequency of the predetermined frequency range.

10. A surface wave resonator device according to claim 1 wherein the distance across the middle grating structure is an integral odd number multiple of one quarter wavelength of the center frequency of the predetermined frequency range.

11. A surface wave resonator device according to claim 1 further comprising at least one surface acoustic wave transducer means disposed on the piezoelectric surface of the substrate means.

12. A surface acoustic wave resonator device according to claim 1 wherein the first and the second reflective grating structures and the middle grating structure all consist essentially of metal fingers.

13. A surface acoustic wave resonator device according to claim 1 wherein the first and the second reflective grating structures and the middle grating structure all consist essentially of grooves formed in the piezoelectric surface.

14. A surfadce acoustic wave resonator device according to claim 1 wherein the first and the second reflective grating structures and the middle grating structure all consist essentially of grooves formed in the piezoelectric surface in combination with metal fingers on the ridges formed between the grooves.

15. A surface wave resonator device comprising in combination:

substrate means having at least a surface layer of piezoelectric material;

first and second reflective grating structures disposed on the piezoelectric surface of the substrate means defining a basic resonator for responding to acoustic surface waves propagating on the piezoelectric surface of the substrate means; and means defining a middle grating structure on the piezoelectric surface of the substrate means between the first and second reflective grating structures for responding to acoustic surface waves propagating on the piezoelectric surface of the substrate means wherein the middle grating structure is substantially non-reflecting at the center frequency for the first and second reflective grating structures.

* * * * *

UNITED STATES PATENT AND TRADEMARK OFFICE
CERTIFICATE OF CORRECTION

PATENT NO. : 4,454,488

DATED : June 12, 1984

INVENTOR(S) : Clinton S. Hartmann

It is certified that error appears in the above-identified patent and that said Letters Patent is hereby corrected as shown below:

Column 10, line 1, in Claim 14 after the word "A" remove the word "surfadce" and insert the word --surface--.

Signed and Sealed this

Twenty-second Day of January 1985

[SEAL]

Attest:

DONALD J. QUIGG

Attesting Officer     Acting Commissioner of Patents and Trademarks